(12) United States Patent
Kim

(10) Patent No.: US 10,461,274 B2
(45) Date of Patent: Oct. 29, 2019

(54) FLEXIBLE DISPLAY DEVICE INCLUDING NOTCH PATTERN IN FOLDING AREA AND FLEXIBLE ELECTRONIC DEVICE INCLUDING THE SAME

(71) Applicant: Samsung Display Co., Ltd., Yongin-si (KR)

(72) Inventor: Se Bong Kim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 15/627,546

(22) Filed: Jun. 20, 2017

(65) Prior Publication Data

US 2018/0138442 A1    May 17, 2018

(30) Foreign Application Priority Data

Nov. 11, 2016  (KR) .......................... 10-2016-0150496

(51) Int. Cl.

| | | |
|---|---|---|
| *H01L 51/52* | (2006.01) | |
| *G06F 3/041* | (2006.01) | |
| *H01L 51/00* | (2006.01) | |
| *H05K 5/00* | (2006.01) | |
| *H05K 5/03* | (2006.01) | |
| *H01L 27/32* | (2006.01) | |

(52) U.S. Cl.
CPC .......... *H01L 51/5237* (2013.01); *G06F 3/041* (2013.01); *H01L 51/0097* (2013.01); *H05K 5/0017* (2013.01); *H05K 5/03* (2013.01); *G06F 2203/04102* (2013.01); *H01L 27/323* (2013.01); *H01L 27/3244* (2013.01); *H01L 51/5284* (2013.01); *H01L 2251/5338* (2013.01); *Y02E 10/549* (2013.01)

(58) Field of Classification Search
CPC .......... G06F 3/041; H05K 5/03; H05K 5/0017
See application file for complete search history.

(56) References Cited

U.S. PATENT DOCUMENTS

| | | | |
|---|---|---|---|
| 9,179,559 B1 | 11/2015 | Kim | |
| 9,348,362 B2 | 5/2016 | Ko et al. | |
| 9,560,751 B2* | 1/2017 | Huitema | ................ H05K 1/028 |
| 9,826,647 B2* | 11/2017 | Nakamura | ................ G06F 1/16 |
| 9,934,706 B2* | 4/2018 | Lim | .......................... G09F 9/00 |

(Continued)

FOREIGN PATENT DOCUMENTS

| | | |
|---|---|---|
| CN | 103927940 | 7/2014 |
| CN | 103985315 | 8/2014 |

(Continued)

OTHER PUBLICATIONS

Office Action dated Jul. 29, 2019, in Chinese Patent Application No. 201710888183.9.

*Primary Examiner* — Binh B Tran
*Assistant Examiner* — Douglas R Burtner
(74) *Attorney, Agent, or Firm* — H.C. Park & Associates, PLC

(57) ABSTRACT

Disclosed is a display device, includes a display area configured to display an image, a non-display area adjacent to the display area, a folding area configured to bend based on a folding line, and a first non-folding area and a second non-folding area positioned at opposite sides of the folding area. A first notch pattern is formed in an overlapping area of the non-display area and the folding area.

17 Claims, 14 Drawing Sheets

(56) References Cited

U.S. PATENT DOCUMENTS

| | | | | |
|---|---|---|---|---|
| 2013/0010405 | A1* | 1/2013 | Rothkopf | H04M 1/0216 |
| | | | | 361/679.01 |
| 2013/0328051 | A1* | 12/2013 | Franklin | H01L 29/786 |
| | | | | 257/59 |
| 2014/0196254 | A1 | 7/2014 | Song | |
| 2015/0035777 | A1* | 2/2015 | Hirakata | G06F 1/1652 |
| | | | | 345/173 |
| 2015/0062525 | A1* | 3/2015 | Hirakata | G02F 1/133305 |
| | | | | 349/158 |
| 2015/0155505 | A1* | 6/2015 | Yamazaki | H01L 27/1266 |
| | | | | 257/40 |
| 2016/0044803 | A1* | 2/2016 | Nakamura | G06F 1/16 |
| | | | | 361/679.01 |
| 2016/0099433 | A1 | 4/2016 | Prushinskiy et al. | |
| 2016/0150656 | A1* | 5/2016 | Maki | G06F 1/1637 |
| | | | | 361/679.01 |
| 2016/0174423 | A1 | 6/2016 | Oh et al. | |
| 2016/0181572 | A1* | 6/2016 | Prushinskiy | G06F 1/1652 |
| | | | | 257/40 |
| 2017/0142847 | A1* | 5/2017 | Park | H05K 5/0017 |
| 2017/0238412 | A1* | 8/2017 | Huitema | G09F 21/02 |
| | | | | 361/749 |
| 2017/0295654 | A1* | 10/2017 | Choi | H05K 5/0017 |
| 2017/0357289 | A1* | 12/2017 | Ahn | H04M 1/0268 |
| 2018/0027673 | A1* | 1/2018 | Andou | H01L 27/3276 |
| | | | | 361/749 |
| 2018/0059738 | A1* | 3/2018 | Knoppert | G06F 1/1681 |
| 2018/0124934 | A1* | 5/2018 | Franklin | H01L 29/786 |
| 2019/0171315 | A1* | 6/2019 | Park | G06F 3/0412 |

FOREIGN PATENT DOCUMENTS

| | | |
|---|---|---|
| CN | 105788458 | 7/2016 |
| CN | 106031308 | 10/2016 |

* cited by examiner

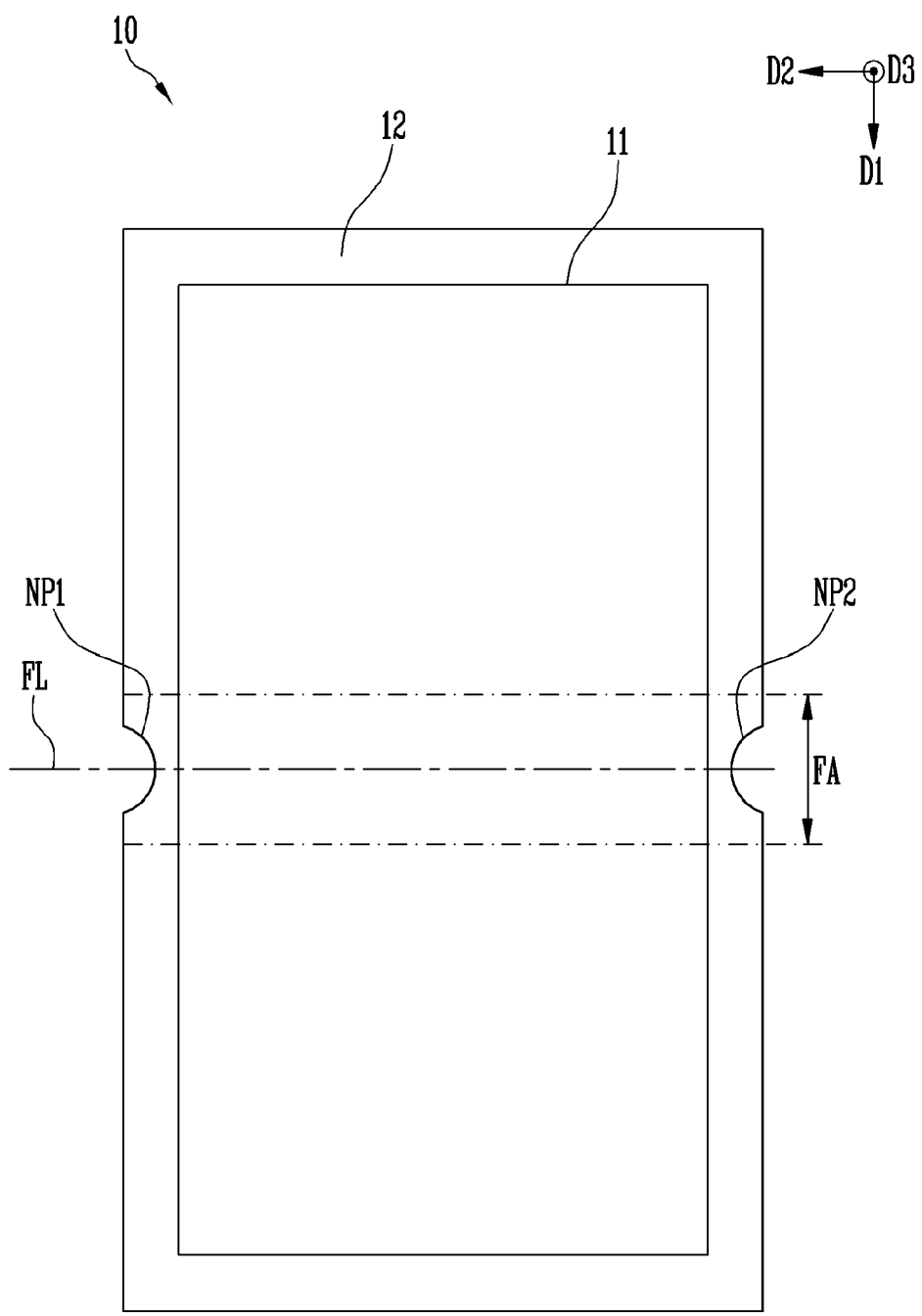

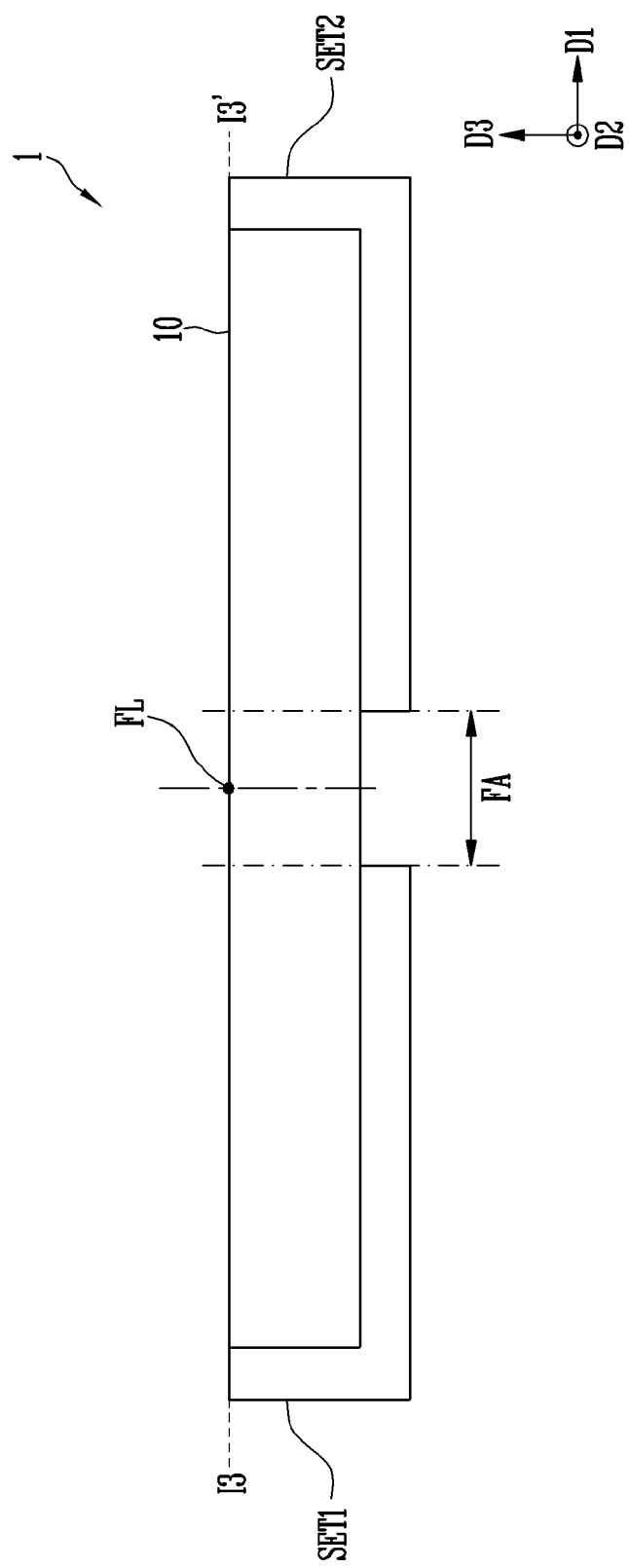

FLEXIBLE DISPLAY DEVICE INCLUDING NOTCH PATTERN IN FOLDING AREA AND FLEXIBLE ELECTRONIC DEVICE INCLUDING THE SAME

CROSS-REFERENCE TO RELATED APPLICATION

This application claims priority from and the benefit of Korean Patent Application No. 10-2016-0150496, filed on Nov. 11, 2016, which is hereby incorporated by reference for all purposes as if fully set forth herein.

BACKGROUND

Field

Exemplary embodiments relate to a display device and an electronic device including the same. More particularly, exemplary embodiments relate to a flexible display device and an electronic device including the same.

Discussion of the Background

In contrast to a flat display device in the related art, various flexible display devices, such as a foldable display device are being developed. However, flexible display devices have layers that separate, de-laminate, or crack due to the stress of repeated folding.

The above information disclosed in this Background section is only for enhancement of understanding of the background of the inventive concept, and, therefore, it may contain information that does not form the prior art that is already known in this country to a person of ordinary skill in the art.

SUMMARY

The present disclosure has been made in an effort to solve the above-described problems associated with the related art, and provides a display device with an improved curve shape, and an electronic device including the same.

Additional aspects will be set forth in the detailed description which follows, and, in part, will be apparent from the disclosure, or may be learned by practice of the inventive concept.

According to exemplary embodiments, a display device includes a display area configured to display an image, a non-display area adjacent to the display area, a folding area configured to bend based on a folding line, and a first non-folding area and a second non-folding area positioned at opposite sides of the folding area. A first notch pattern is formed in an overlapping area of the non-display area and the folding area.

Another exemplary embodiment of the present disclosure provides an electronic device, including: a display device; and a case adjacent to the display device, in which the display device includes: a display area configured to display an image; a non-display area adjacent to the display area; a folding area configured to bend based on a folding line; and a first non-folding area and a second non-folding area positioned at opposite sides of the folding area. A notch pattern is formed in an overlapping area of the non-display area and the folding area.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 6A is a top plan view illustrating one surface of the display device according to exemplary embodiments of the present disclosure.

FIG. 9 is a cross-sectional view illustrating an electronic device according to exemplary embodiments of the present disclosure.

DETAILED DESCRIPTION OF THE ILLUSTRATED EMBODIMENTS

Figure 1A:
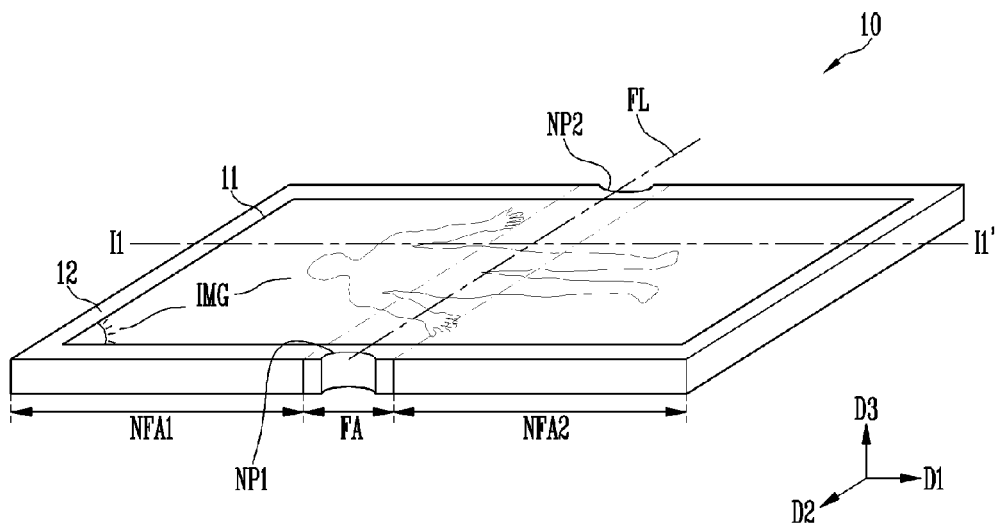
FIG. 1A is a perspective view illustrating an unfolded state of a display device according to exemplary embodiments of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A conventional flexible display device includes a flexible display panel and various functional members. The conventional flexible display panel includes a substrate, various functional layers disposed on the substrate, and pixels disposed on the substrate. The conventional flexible display panel also includes an encapsulation layer that is laminated to other layers in the display panel with an adhesive.

However, when the conventional flexible display device is folded repeatedly, a maximum stress line formed at a curve or bending area of the display device may not be parallel to a folding line. Alternatively or additionally, the maximum stress line may not form a straight line.

Because the maximum stress line is not parallel (or substantially parallel) to the folding line or is not in a straight line in the conventional flexible display device, the encapsulation layer de-laminates from the adhesive connecting the encapsulation layer to the other layers of the display panel. This de-lamination phenomenon destroys a combination of layers attached with the optically clear adhesive member to the encapsulation layer. Moreover, this de-lamination phenomenon causes one or more films of the flexible display panel to crack leading to operational and visual defect in the conventional display device.

Accordingly, in order to reduce or eliminate the de-lamination phenomenon, film cracking and other forms of layer destruction resulting from repeated folding or partially folded (e.g., curved), a display device and electronic device are described below with respect to various exemplary embodiments that have a maximum stress line parallel or substantially parallel to a folding line.

FIG. 1A is a perspective view illustrating an unfolded state of a display device according to exemplary embodiments of the present disclosure. FIG. 1A illustrates an unfolded state of a display device 10 according to exemplary embodiments of the present disclosure, but the state of the display device 10 may be changed to a folded state through a folding behavior.

Here, the meaning of "being folded" includes "being curved", and includes the state where the facing surfaces are not in contact with each other, as well as the state where the facing surfaces are in contact with each other, when the display device 10 is folded based on a folding line FL. This will be described in detail with reference to FIGS. 4A and 4B.

As illustrated in FIG. 1A, a display surface, on which an image IMG is displayed, on the display device 10, may be parallel to a surface defined by a first directional axis D1 and a second direction axis D2.

A normal line direction of the display surface may be indicated with a third directional axis D3. That is, the third directional axis D3 may indicate a thickness direction of the display device 10. A front surface and a rear surface of each member may be divided by the third directional axis D3. However, the directions indicated by the directional axes D1, D2, and D3 are relative concepts, and may be converted to other directions.

FIG. 1A illustrates the foldable display device as an example, but the present disclosure is not limited thereto.

For example, the display device 10 according to the exemplary embodiments of the present disclosure may be applied to various display devices 10, such as a curved display, a bendable display device, a rollable display device, and a stretchable display device.

Although not separately illustrated, the display device 10 according to the exemplary embodiments of the present disclosure may be applied to electronic devices, such as a television, a billboard, a cellular phone, a personal computer, a laptop computer, a personal digital terminal, a navigation device, a game device, a portable electronic device, an Internet of Things (IoT) device, and a camera.

Referring to FIG. 1A, the display device 10 may include a plurality of areas divided on the display surface.

First, the areas, which are divided based on the display of the image IMG, will be described.

The display device 10 may include a display area 11 and a non-display area 12.

The display area 11 may be an area, on which the image IMG is displayed, in the display surface of the display device 10. As illustrated in FIG. 1A, the display area 11 may have a quadrangular shape, but the present disclosure is not limited thereto. For convenience of the description, the sun and a standing person are illustrated in FIG. 1A as an example of the image IMG, but the present disclosure is not limited thereto.

The non-display area 12 may be an area which is adjacent to the display area 11 and on which the image IMG is not displayed. The non-display area 12 may surround the display area 11.

Next, the areas divided based on the folding behavior will be described. Further, the display device 10 may include a folding area FA, a first non-folding area NFA1, and a second non-folding area NFA2.

The folding area FA may be an area folded along the folding line FL. According to the exemplary embodiments, when the display device 10 has a quadrangular shape or a concave streamlined shape (see FIG. 6C), a minimum width of the display device 10 may be at a position corresponding to the folding line FL. In other words, a width of the display device 10 outside of the folding area FA is greater than a width of the display device within the folding area FA.

The first non-folding area NFA1 and the second non-folding area NFA2 may be the areas, which are formed at both sides of the folding area FA and are not folded. For example, as illustrated in FIG. 1A, the first non-folding area NFA1 may be an area formed in a direction opposing to the first directional axis D1 based on the folding area FA, and the second non-folding area NFA2 may be an area formed in the direction of the first directional axis D1 based on the folding area FA, but the present disclosure is not limited thereto.

The division of the folding area FA, the first non-folding area NFA1, and the second non-folding area NFA2 may be independent of the division of the display area 11 and the non-display area 12. Accordingly, a part of each of the folding area FA, the first non-folding area NFA1, and the second non-folding area NFA2 may be set in the display area 11. Similarly, the remaining part of each of the folding area FA, the first non-folding area NFA1, and the second non-folding area NFA2 may be set in the non-display area 12.

The folding line FL may be a line serving as a reference when the display device 10 performs the folding behavior. FIG. 1A illustrates that the folding line FL may be positioned in the display surface of the display device 10, but the present disclosure is not limited thereto, and the folding line FL may also be positioned on the rear surface of the display device 10.

The display device 10 may be folded along the folding line FL so that the display surface of the first non-folding area NFA1 and the display surface of the second non-folding area NFA2 face each other. Hereinafter, the state where the display device 10 may be folded so that the display surfaces of the different non-folding areas face is defined as inner folding.

The display device 10 may be folded along the folding line FL so that the display surface of the first non-folding area NFA1 and the display surface of the second non-folding area NFA2 face the outside. Hereinafter, the state where the display device 10 is folded so that the display surfaces of the different non-folding areas head the outside is defined as outer folding.

For example, when the display device 10 performs the inner folding, the folding line FL may be positioned on the display surface of the display device 10, and in contrast to this, when the display device 10 performs the outer folding, and the folding line FL may be positioned on the rear surface of the display device 10.

The display device 10 may include notch patterns NP1 and NP2.

The notch patterns NP1 and NP2 may mean recesses recessed in a concave form from a side portion to a center portion of the display device 10, or holes heading from the display surface to the rear surface of the display device 10.

The notch patterns NP1 and NP2 may be formed in an area, in which the folding area FA and the non-display area 12 overlap. One or more notch patterns may be formed in one surface of the display device 10. Further, as illustrated in FIG. 1A, the notch pattern NP2 may be formed at an opposite side to the notch pattern NP1.

FIG. 1A illustrates the display device 10, in which the notch patterns NP1 and NP2 are formed in the area, in which the folding area FA and the non-display area 12 overlap. However, the present disclosure is not limited thereto, and as described above, the display device 10 may include only one notch pattern, and may include a plurality of notch patterns, and each notch pattern may be formed in various forms. For example, the notch patterns NP1 and NP2 may be positioned at both ends of the folding area FA, respectively, and may be formed in shapes, of which left and right sides are reversed. Further, the notch patterns NP1 and NP2 may have an axisymmetric structure based on the folding line FL.

The notch patterns NP1 and NP2 may have circular or polygonal shapes, but the present disclosure is not limited thereto. This will be described in detail with reference to FIGS. 7A, 7B, 7C, and 7D.

Figure 1B:
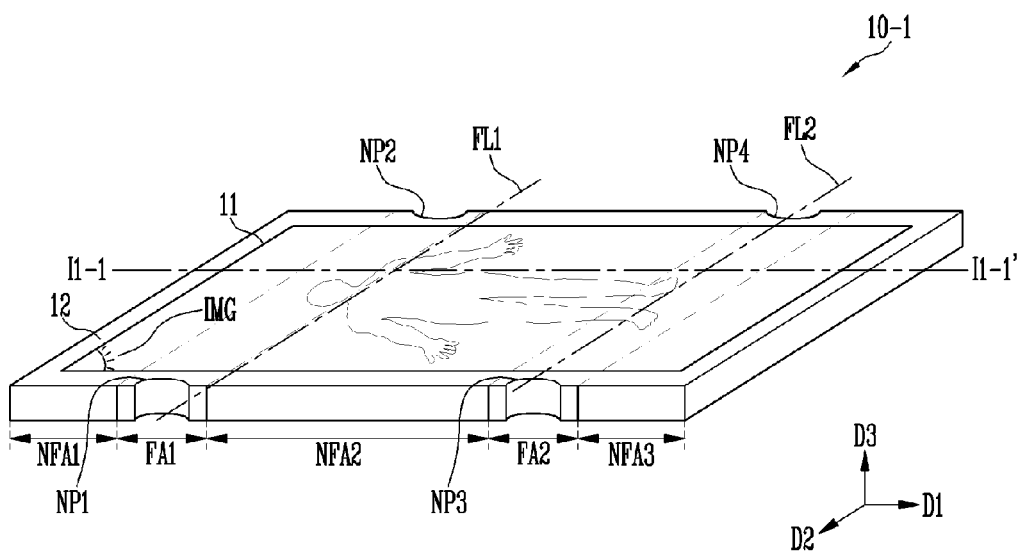
FIG. 1B is a perspective view illustrating an unfolded state of a display device according to exemplary embodiments of the present disclosure.

FIG. 1B is a perspective view illustrating an unfolded state of a display device according to exemplary embodiments of the present disclosure.

For convenience of the description, differences from the display device 10 illustrated in FIG. 1A will be mainly described, and overlapping contents will be omitted.

Referring to FIG. 1B, a display device 10-1 may include a display area 11 and a non-display area 12. Further, the display device 10-1 may include first and second folding areas FA1 and FA2, and first, second, and third non-folding areas NFA1, NFA2, and NFA3.

The first folding area FA1 may be an area folded along a first folding line FL1. The second folding area FA2 may be an area folded along a second folding line FL2.

According to the exemplary embodiments, when the display device 10-1 has a quadrangular shape or a concave streamlined shape (see FIG. 6C), a minimum width of the display device 10-1 may be at a position corresponding to any one of the first and second folding lines FL1 and FL2.

The first non-folding area NFA1, the second non-folding area NFA2, and the third non-folding area NFA3 may be the unfolded areas. The first non-folding area NFA1 and the second non-folding area NFA2 may be the areas formed at both sides of the first folding area FA1, and the second non-folding area NFA2 and the third non-folding area NFA3 may be the areas formed at both sides of the second folding area FA2.

For example, as illustrated in FIG. 1B, the first non-folding area NFA1 may be the area formed in an opposite direction to the first directional axis D1 based on the first folding area FA1, the second non-folding area NFA2 may be the area formed in the direction of the first directional axis D1 based on the first folding area FA1, the second non-folding area NFA2 may be the area formed in the opposite direction to the first directional axis D1 based on the second folding area FA2, and the third non-folding area NFA3 may be the area formed in the direction of the first directional axis D1 based on the second folding area FA2, but the present disclosure is not limited thereto.

The division of the first and second folding areas FA1 and FA2, and the first, second, and third non-folding areas NFA1, NFA2, and NFA3 is independent of the division of the display area 11 and the non-display area 12. Accordingly, a part of each of the first and second folding areas FA1 and FA2, and the first, second, and third non-folding areas NFA1, NFA2, and NFA3 may be set in the display area 11. Similarly, the remaining part of each of the first and second folding areas FA1 and FA2, and the first, second, and third non-folding areas NFA1, NFA2, and NFA3 may be set in the non-display area 12.

The display device 10-1 may be folded along the first and second folding lines FL1 and FL2. For example, the first folding line FL1 may be positioned in a rear surface of the display device 10-1, and the second folding line FL2 may be positioned in a display surface of the display device 10-1. The display device 10-1 may perform outer folding along the first folding line FL1, and may perform inner folding along the second folding line FL2, but the present disclosure is not limited thereto.

The display device 10-1 may include notch patterns NP1, NP2, NP3, and NP4.

The notch patterns NP1, NP2, NP3, and NP4 may mean recesses in a concave shape formed from a side portion to a center portion of the display device 10-1, or holes heading from the display surface to the rear surface of the display device 10-1.

The notch patterns NP1, NP2, NP3, and NP4 may be formed in the areas, in which the first and second folding areas FA1 and FA2 and the non-display area 12 overlap. One or more notch patterns may be formed in one surface of the display device 10-1. Further, as illustrated in FIG. 1B, the second notch pattern NP2 may be formed at an opposite side of the first notch pattern NP1, and the fourth notch pattern NP4 may be formed at an opposite side of the third notch pattern NP3.

FIG. 1B illustrates the display device 10-1, in which the notch patterns NP1, NP2, NP3, and NP4 are formed in the areas, in which the first and second folding areas FA1 and FA2 and the non-display area 12 overlap. However, the present disclosure is not limited thereto, and as described above, the display device 10-1 may include only one notch pattern, and may include a plurality of notch patterns, and each notch pattern may be formed in various forms. For example, the notch patterns NP1, NP2, NP3, and NP4 may be positioned at both ends of the first and second folding area FA1 and FA2, and may be formed in shapes, of which left and right sides are reversed. Further, each of the notch patterns NP1, NP2, NP3, and NP4 may have an axisymmetric structure based on the first and second folding lines FL1 and FL2.

The notch patterns NP1, NP2, NP3, and NP4 may have circular shapes or polygonal shapes, but the present disclosure is not limited thereto. This will be described in detail with reference to FIGS. 7A, 7B, 7C, and 7D.

Figure 2A:
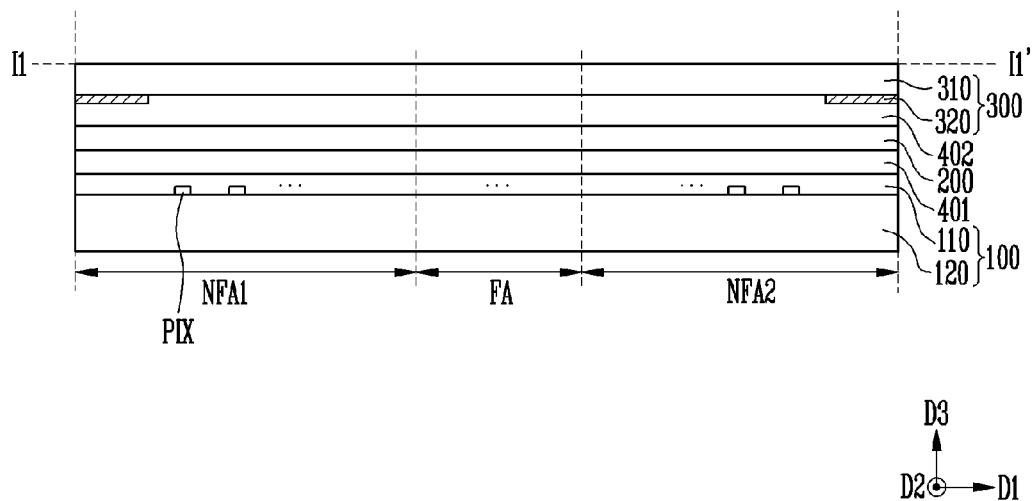
FIG. 2A is a cross-sectional view illustrating an enlarged one cross-section of the display device of FIG. 1A according to exemplary embodiments of the present disclosure.

FIG. 2A is a cross-sectional view illustrating an enlarged one cross-section of the display device of FIG. 1A according to exemplary embodiments of the present disclosure. FIG. 2A illustrates a cross-section of the display device 10 illustrated in FIG. 1A taken along line I1-I1' in a plane formed by the first directional axis D1 and the third directional axis D3.

Figure 2B:
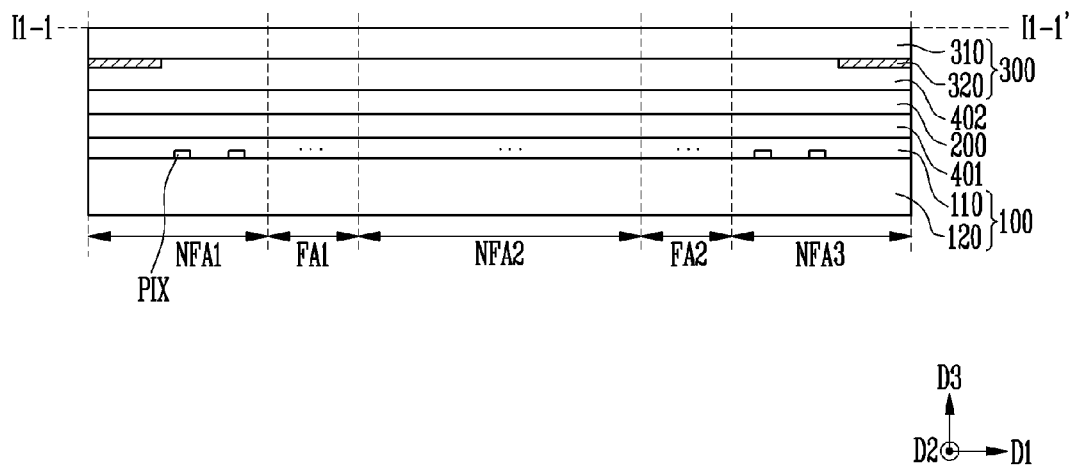
FIG. 2B is a cross-sectional view illustrating an enlarged one cross-section of the display device of FIG. 1B according to exemplary embodiments of the present disclosure.

FIG. 2B is a cross-sectional view illustrating an enlarged one cross-section of the display device of FIG. 1B according to exemplary embodiments of the present disclosure. FIG. 2B illustrates a cross-section of the display device 10-1 illustrated in FIG. 1B taken along line I1-I1' in a plane formed by the first directional axis D1 and the third directional axis D3.

Except that the display device 10 illustrated in FIG. 2A includes the folding area FA and the first and second non-folding areas NFA1 and NFA2, and the display device 10-1 illustrated in FIG. 2B includes the first and second folding areas FA1 and FA2, and the first, second, and third non-folding areas NFA1, NFA2, and NFA3, the structure of the display device 10 of FIG. 2A may be the same as the structure of the display device 10-1 of FIG. 2B. Accordingly, the description of the display device 10 illustrated in FIG. 2A may be applied to the display device 10-1 illustrated in FIG. 2B as it is. Hereinafter, the cross-section of the display device 10 illustrated in FIG. 2A will be representatively described.

Referring to FIG. 2A, the display device 10 may include a display panel 100, a touch sensor 200, and a window member 300. The display device 10 may further include optically clear adhesive members 401 and 402. Although not separately illustrated, the display device 10 may further include a lower cover panel formed under the display panel 100.

The display panel 100 may generate the image IMG (see FIG. 1A) corresponding to input image data. The display panel 100 may be a Liquid Crystal Display (LCD) panel, an Organic Light Emitting Display (OLED) panel, an electrophoretic display panel, an electro wetting display panel, and the like, and the kind of display panel is not limited. The present disclosure will be described with the OLED panel as an example.

The display panel 100 may include a plurality of pixels PIXs, an encapsulation layer 110, and a substrate 120. Although not illustrated in FIG. 2A, the display panel 100 may further include a circuit layer and an optical member (for example, a phase retardation plate, and a polarizing plate).

The plurality of pixels PIXs may generate an optical signal. The plurality of pixels PIXs may be implemented with a plurality of organic light emitting diodes. Although not illustrated in FIG. 2A, the display panel 100 may further include electronic devices assisting the plurality of pixels PIXs.

The encapsulation layer 110 may encapsulate the plurality of pixels PIXs. The encapsulation layer 110 may be implemented with a Thin Film Encapsulation (TFE) layer, and may include a plurality of inorganic thin film layers and a plurality of organic thin film layers.

The substrate 120 may include one or more plastic films.

For example, the substrate 120 may be formed of plastic, such as polyimide, polyethylene terephthalate (PET), polycarbonate, polyethylene naphthalate, polyarylate (PAR), and polyetherimide, having excellent heat resistance and durability.

Further, the substrate 120 may further include inorganic layers (for example, a silicon nitride layer, and/or a silicon oxide layer).

A circuit layer may include a plurality of signal lines, for example, a gate line and a data line, provided in the display panel 100, and may include other electronic devices. The plurality of signal lines and the electronic devices may be insulated by insulating layers.

An optical member may control a property (for example, a phase delay or polarization) of an optical signal output from the display panel 100.

The touch sensor 200 may receive a touch signal and obtain coordinate information about an input point, and convert the coordinate information into an electronic signal and output the electronic signal. The touch sensor 200 may be disposed on a front surface of the display panel 100. However, a position relation between the display panel 100 and the touch sensor 200 is not limited thereto, and the display panel 100 may include the touch sensor 200.

The touch sensor 200 may be a contact type or a contactless type touch panel. For example, the touch sensor 200 may be a resistive touch panel, an electromagnetic inductive touch panel, a capacitive touch panel, and the like, but the present disclosure is not limited thereto.

The touch sensor 200 may include a basic member and one or more conductive layers. One or more conductive layers may be disposed on the basic member.

The conductive layer may include a transparent conductive oxide, for example, an indium tin oxide (ITO), an indium zinc oxide (IZO), a zinc oxide (ZnO), and an indium tin zinc oxide (ITZO).

The conductive layer may include metal, such as molybdenum, silver, titanium, copper, aluminum, and an alloy thereof. The conductive layer may include PEDOT, nanowire, and graphene. The conductive layer may include a first layer include any one among the aforementioned materials, a second layer including another one, and many other layers. The conductive layer may include a plurality of conductive patterns disposed on one surface of the basic member. The plurality of conductive patterns may form signal lines of the touch sensor 200.

The window member 300 may protect the display panel 100 and the touch sensor 200 from an external change. The window member 300 may include a cover member 310 and a black matrix 320.

The cover member 310 may include a base film and a functional layer. The function layer may be disposed on the base film. The base film is a flexible plastic film, and may include at least one of organic materials, such as polyimide (PI), polyethyleneterephthalate (PET), polyethylenenaphthalate (PEN), and polyethersulphone (PES), and inorganic materials, such as silicon oxide, silicon nitride, silicon oxynitride, aluminum oxide, aluminum nitride, titanium oxide, and titanium nitride, and may be formed in a laminated structure including two or more structures.

The functional layer may include a hard coating layer, a self-healing layer, an anti-reflection layer, and an anti-finger layer.

The black matrix 320 may be formed on a rear surface of the cover member 310. The black matrix 320 may define a bezel area, that is, the non-display area 12 (see FIG. 1A) of the display device 10.

The black matrix 320 may be a color organic layer, and may be formed by a coating method.

The display panel 100 and the touch sensor 200 may be coupled by an optically clear adhesive member 401. The touch sensor 200 and the window member 300 may also be coupled by an optically clear adhesive member 402. However, the present disclosure is not limited thereto.

According to an exemplary embodiment, any one of the two optically clear adhesive members 401 and 402 may be omitted. The display panel 100 and the touch sensor 200 may be manufactured by a continuous process, so that the touch sensor 200 may be directly disposed on the display panel 100. Further, the touch sensor 200 and the window member 300 may be manufactured by a continuous process, so that the window member 300 may be directly disposed on the touch sensor 200.

Figure 3A:
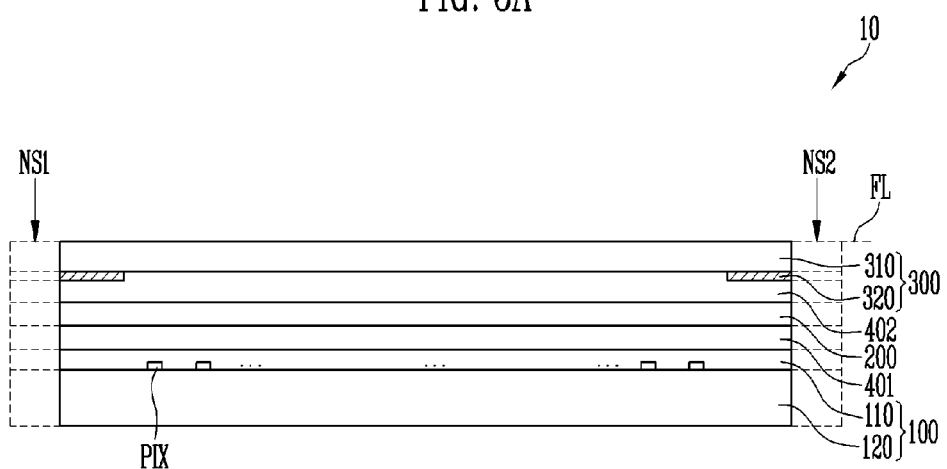
FIGS. 3A and 3B are cross-sectional views illustrating another enlarged cross-section of the display device according to exemplary embodiments of the present disclosure.
Figure 3B:
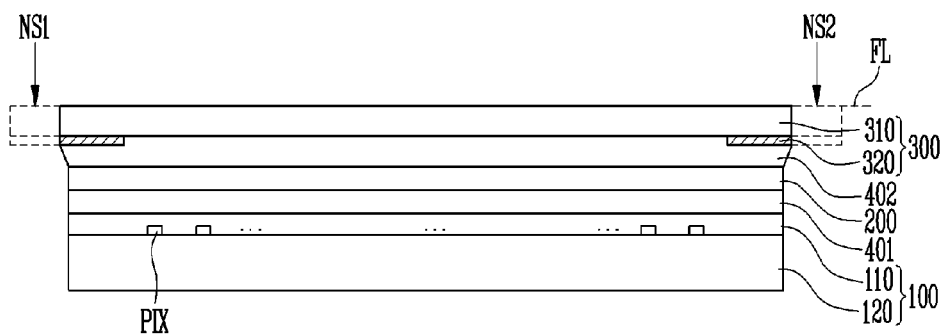

FIGS. 3A and 3B are cross-sectional views illustrating another enlarged cross-section of the display device according to exemplary embodiments of the present disclosure. FIGS. 3A and 3B illustrate a cross-section of the display device 10 illustrated in FIG. 1A taken along line the folding line FL in a plane formed by the second directional axis D2 and the third directional axis D3. In order to avoid the overlapping of the description, contents overlapping the contents described with reference to FIG. 2A will be omitted.

Referring to FIGS. 1A and 3A and 3B, the display device 10 may include the notch patterns NP1 and NP2 at both sides of the display device 10 along the folding line FL.

As described above, the notch patterns NP1 and NP2 may be implemented in a form of a hole from the display surface to the rear surface of the display device 10. Accordingly, notch spaces NS1 and NS2 indicated with a dotted line in FIG. 3A may mean the notch patterns NP1 and NP2 of FIG. 1A.

In FIG. 3A, the notch patterns NP1 and NP2 are illustrated with holes, which are formed at both sides of the display device 10, and pass through in a normal line direction (for example, the third directional axis D3) of the display surface of the display device 10.

That is, as illustrated in FIG. 3A, the notch patterns NP1 and NP2 may be the cutouts passing through the display panel 100, the touch sensor 200, and the window member 300 in the normal line direction (for example, the third directional axis D3) of the display surface. However, the present disclosure is not limited thereto. According to exemplary embodiments, the notch patterns NP1 and NP2 may be the cutouts passing through the display panel 100, the touch sensor 200, the optically clear adhesive members 401 and 402, and the window member 300 in the normal line direction (for example, the third directional axis D3) of the display surface.

In FIG. 3B, the notch patterns NP1 and NP2 are illustrated with cutouts formed at both sides of the window member 300 included in the display device 10 from the display surface to the rear surface.

According to exemplary embodiments, a width of each of the display panel 100 and the touch sensor 200 may be implemented to be smaller than a width of the window member 300.

That is, as illustrated in FIG. 3B, the notch patterns NP1 and NP2 may be cutouts passing through only the window member 300 in the normal line direction (for example, the third directional axis D3) of the display surface.

The description with reference to FIGS. 3A and 3B may be equally applied to the cross-section of the display device 10-1 illustrated in FIG. 1B taken along any one of the first and second folding lines FL1 and FL2 in the plane formed by the second directional axis D2 and the third directional axis D3.

Figure 4A:
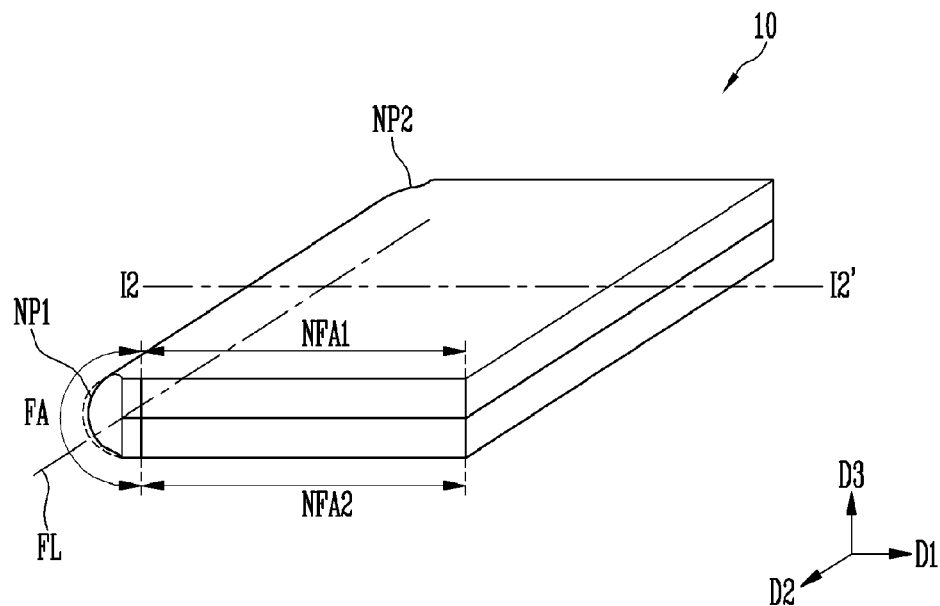
FIG. 4A is a perspective view illustrating a folded state of the inwardly folded display device of FIG. 1A according to exemplary embodiments of the present disclosure.
Figure 4B:
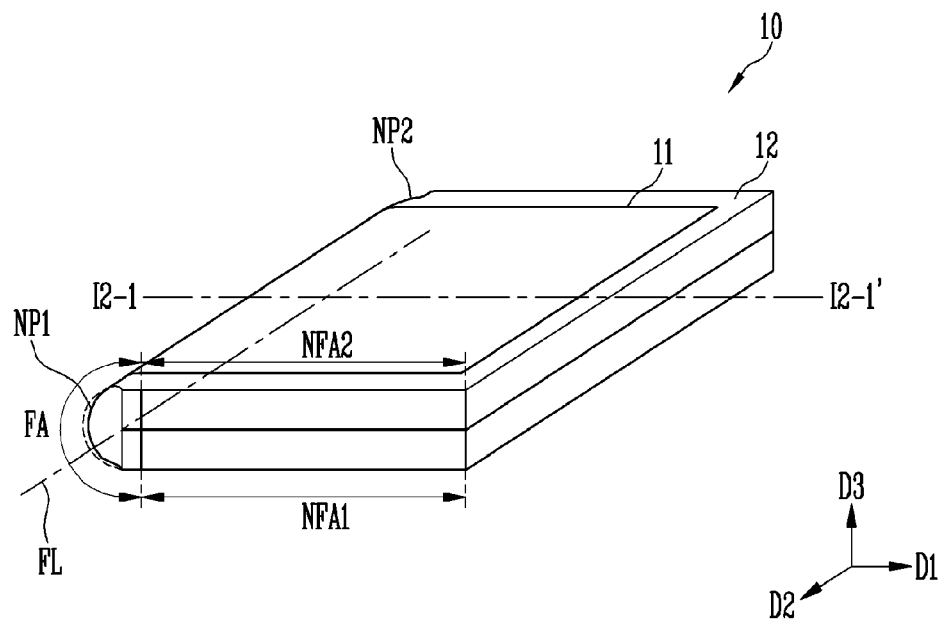
FIG. 4B is a perspective view illustrating a folded state of the outwardly folded display device of FIG. 1A according to exemplary embodiments of the present disclosure.
Figure 4C:
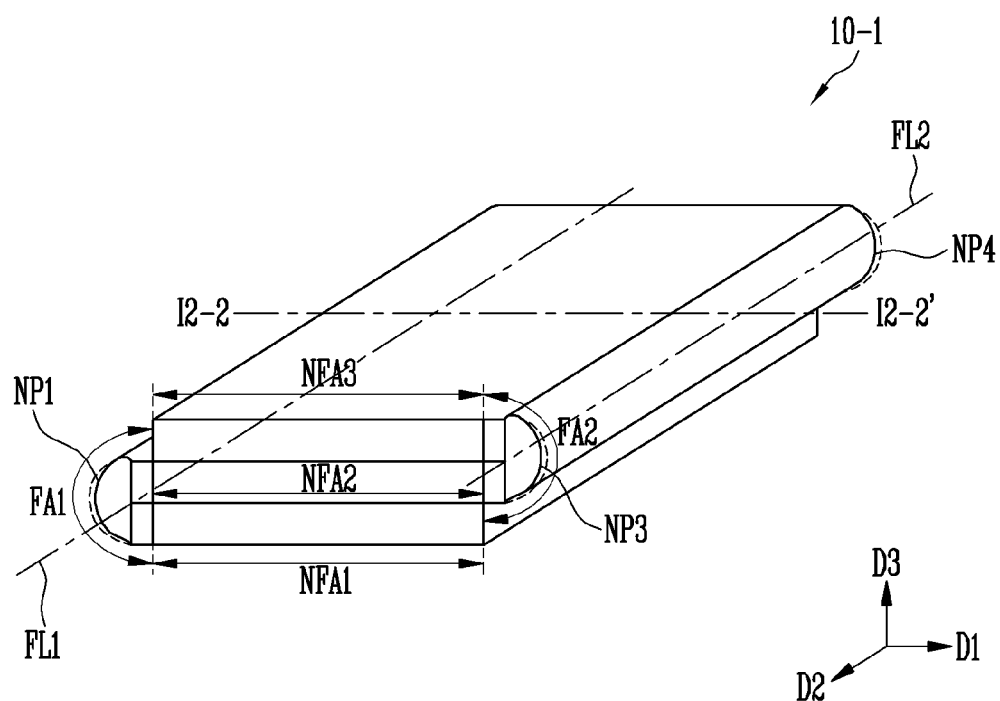
FIG. 4C is a perspective view illustrating a folded state of the display device of FIG. 1B according to exemplary embodiments of the present disclosure.

FIG. 4A is a perspective view illustrating a folded state of the inwardly folded display device of FIG. 1A according to exemplary embodiments of the present disclosure. FIG. 4B is a perspective view illustrating a folded state of the outwardly folded display device of FIG. 1A according to exemplary embodiments of the present disclosure. FIG. 4C is a perspective view illustrating a folded state of the display device of FIG. 1B according to exemplary embodiments of the present disclosure.

FIGS. 4A and 4B illustrate a folded state of the display device 10 according to exemplary embodiments of the present disclosure, but the state of the display device 10 may be changed to an unfolded state through a folding behavior. Further, FIG. 4C illustrates a folded state of the display device 10-1 according to exemplary embodiments of the present disclosure, but the state of the display device 10-1 may be changed to an unfolded state through a folding behavior.

As illustrated in FIG. 4A, the first non-folding area NFA1 rotates along the folding line FL, so that the display device 10 may perform the inner folding. As illustrated in FIG. 4B, the first non-folding area NFA1 rotates in another direction along the folding line FL, so that the display device 10 may perform the outer folding.

As illustrated in FIG. 4C, when the display device 10-1 includes the first and second folding areas FA1 and FA2, the first non-folding area NFA1 rotates along the first folding line FL1 and the third non-folding area NFA3 rotates in another direction along the second folding line FL2, so that the display device 10-1 may be folded in a shape of "Z". However, the present disclosure is not limited thereto.

Figure 5A:
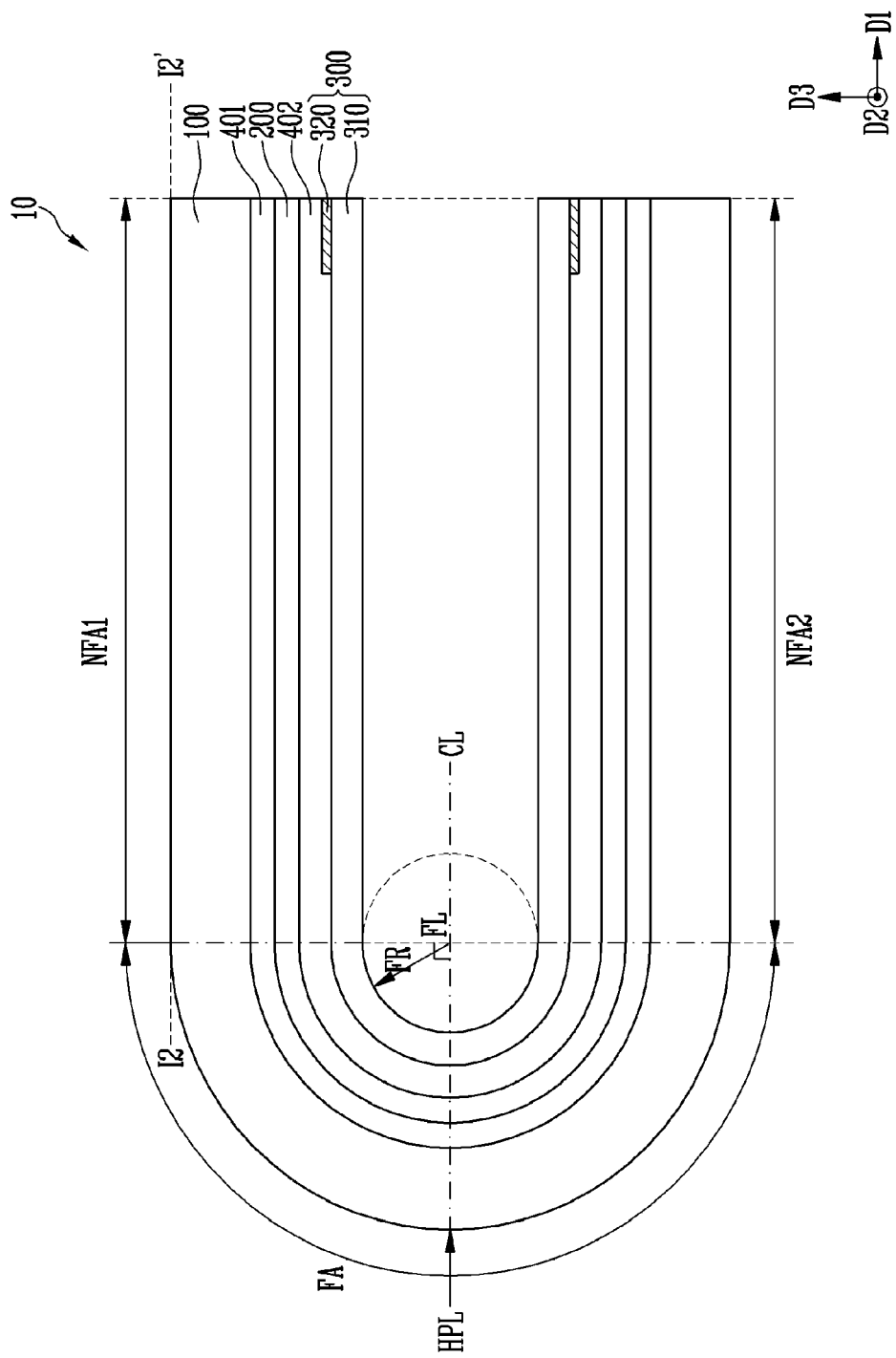
FIG. 5A is a cross-sectional view illustrating an enlarged one cross-section of the display device of FIG. 4A according to exemplary embodiments of the present disclosure.

FIG. 5A is a cross-sectional view illustrating an enlarged one cross-section of the display device illustrated in FIG. 4A according to exemplary embodiments of the present disclosure. FIG. 5A illustrates a cross-section of the display device 10 illustrated in FIG. 4A taken along line I2-I2' in a plane formed by the first directional axis D1 and the third directional axis D3.

Figure 5B:
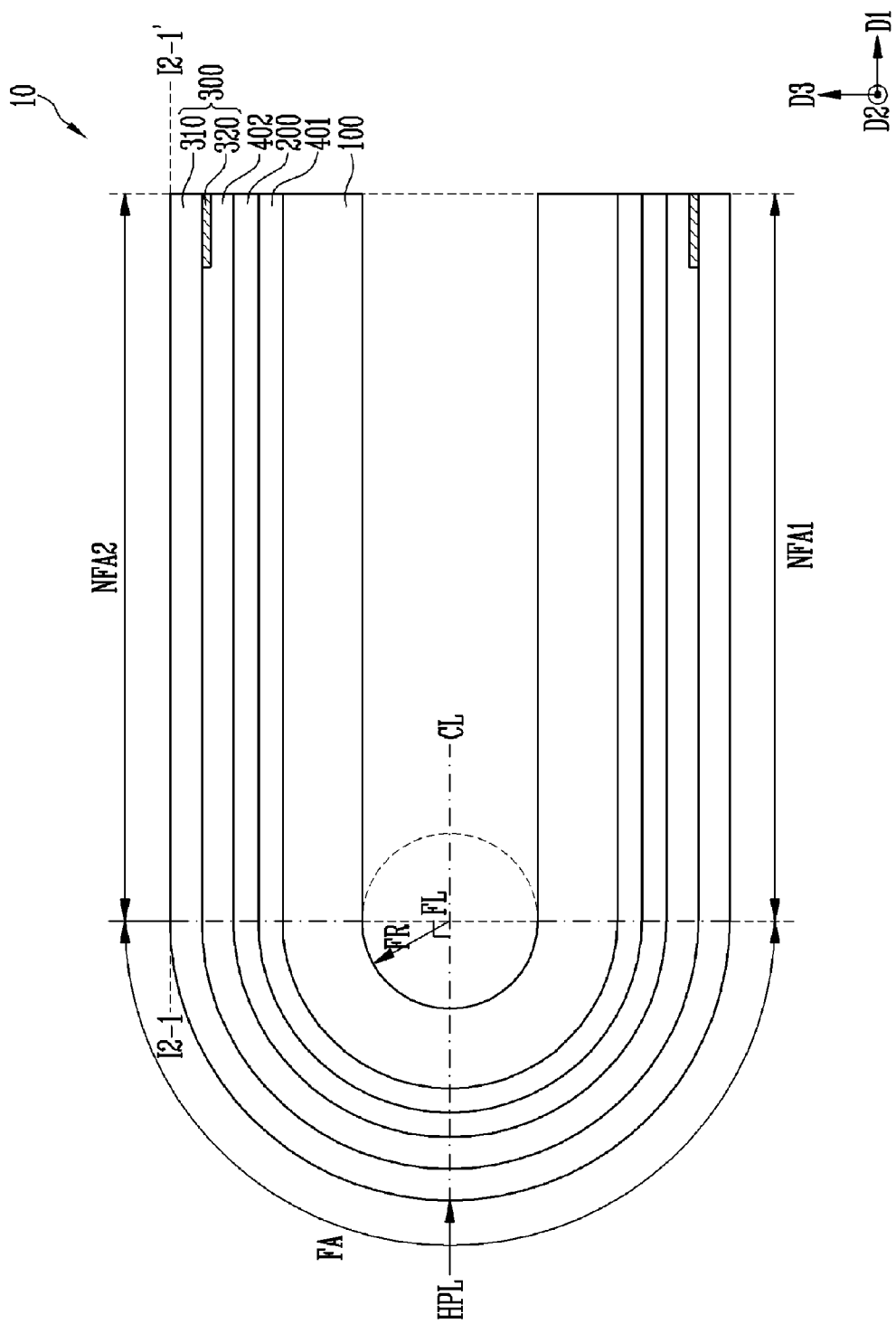
FIG. 5B is a cross-sectional view illustrating an enlarged one cross-section of the display device of FIG. 4B according to exemplary embodiments of the present disclosure.

FIG. 5B is a cross-sectional view illustrating an enlarged one cross-section of the display device of FIG. 4B according to exemplary embodiments of the present disclosure. FIG. 5B illustrates a cross-section of the display device 10 illustrated in FIG. 4B taken along line I2-1-I2-1' in a plane formed by the first directional axis D1 and the third directional axis D3.

The description of the cross-section of the display device 10 illustrated in FIG. 5A may be applied to the description of FIG. 5B, except for the aforementioned difference (for example, the folding direction).

Figure 5C:
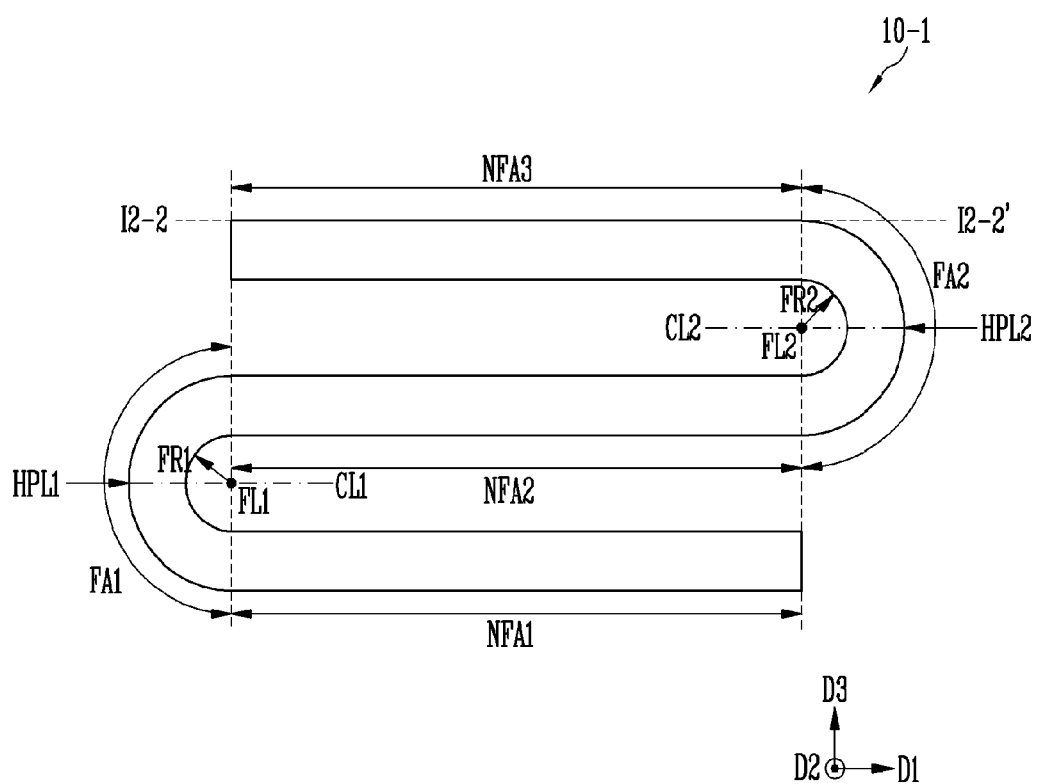
FIG. 5C is a cross-sectional view illustrating an enlarged one cross-section of the display device of FIG. 4C according to exemplary embodiments of the present disclosure.

FIG. 5C is a cross-sectional view illustrating an enlarged one cross-section of the display device of FIG. 4C according to exemplary embodiments of the present disclosure. FIG. 5C illustrates a cross-section of the display device 10-1 illustrated in FIG. 4C taken along line I2-2-I2-2' in a plane formed by the first directional axis D1 and the third directional axis D3.

The cross-sections of the display device 10 illustrated in FIGS. 5A and 5B and the cross-section of the display device 10-1 illustrated in FIG. 5C have substantially similar functions and configurations, except that FIG. 5A illustrates the display device 10 acting the inner folding, FIG. 5B illustrates the display device 10 acting the outer folding, and FIG. 5C illustrates the display device 10 acting the outer folding in the first folding area FA1 and acting the inner folding in the second folding area FA2, so that the present disclosure will be described representatively based on FIG. 5A below.

Figure 3B:
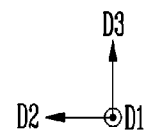

In order to avoid the overlapping of the description, contents overlapping the contents described with reference to FIGS. 1A, 2A, and 3 will be omitted in the description with reference to FIG. 5A.

Referring to FIGS. 4A and 5A, the display device 10 may perform the inner folding along the folding line FL. As described above, the display device 10 may perform the inner folding so that the first non-folding area NFA1 and the second non-folding area NFA2 are not in contact with each other, but face each other. In this case, the folding area FA may be folded so as to have a folding radius RF based on the folding line FL as illustrated in FIG. 5A.

Stress means resistance generated inside a material in response to a size of a load when the load (external force), such as compression, tensileness, bending, and torsion, is applied to the material.

Stress is increased according to an increase in external force, but there is a limit in the stress, so that when stress reaches a unique limit of the material, the stress cannot be resistive to the external force, so that the material is finally destroyed. Unit stress refers to stress per unit area, and the stress used hereinafter refers to the unit stress.

In the display device 10 acting the folding behavior, stress according to external force of the folding area FA may be generated.

Ideally, when the folding area FA is folded so as to have the uniform folding radius FR based on the folding line FL as illustrated in FIG. 5A, stress generated in the folding area FA may be evenly generated.

However, it is physically difficult to implement the perfect folding radius FR. Accordingly, a maximum stress point, at which stress is concentrated, may be formed at a specific point in an external curved surface of the folding area FA. A maximum stress line HPL means a line as a set of maximum stress points.

A center surface CL illustrated in FIG. 5A means a plane, which includes the folding line FL, and in which the first directional axis D1 and the second directional axis D2 are formed.

According to exemplary embodiments of the present disclosure, the display device 10 may be designed so that the maximum stress line HPL is formed on the center surface CL.

Referring to FIGS. 1A, 4A, and 5A, the notch patterns NP1 and NP2 may guide the display device 10 to perform the folding behavior along the ideal folding line FL when the display device 10 performs the folding behavior. Accordingly, the maximum stress line HPL may be set to be parallel to the folding line FL.

The description with reference to FIG. 5A may be applied to the descriptions with reference to FIGS. 5B and 5C.

FIG. 6A is a top plan view illustrating one surface of the display device according to exemplary embodiments of the present disclosure. Referring to FIGS. 1A and 6A, FIG. 6A illustrates one surface of the display device 10 including the notch patterns NP1 and NP2.

As described above, the notch patterns NP1 and NP2 may be formed in an area, in which the non-display area 12 and the folding area FA overlap.

FIG. 6A illustrates the notch patterns NP1 and NP2 with circular recesses, but as described above, the notch patterns NP1 and NP2 may be implemented with various forms. This will be described in detail with reference to FIGS. 7A, 7B, 7C, and 7D.

According to exemplary embodiments, a minimum width of the display device 10 may be at a position corresponding to the folding line FL.

Figure 6B:
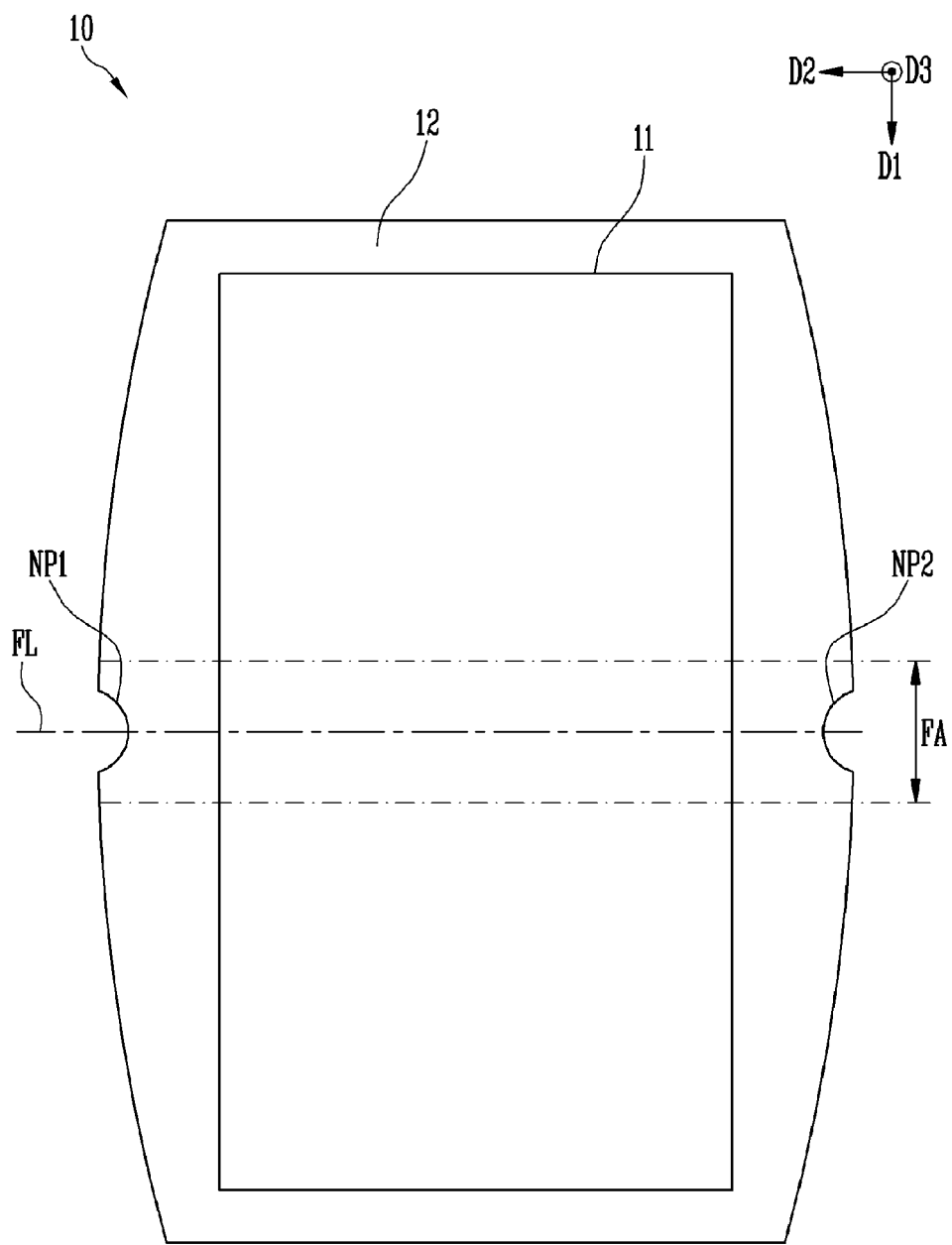
FIG. 6B is a top plan view illustrating one surface of the display device according to exemplary embodiments of the present disclosure.

FIG. 6B is a top plan view illustrating one surface of the display device according to exemplary embodiments of the present disclosure. In order to avoid the overlapping of the description, contents overlapping the contents described with reference to FIG. 6A will be omitted in the description with reference to FIG. 6B.

As illustrated in FIG. 6B, the display device 10 may have a convex parabola shape. For example, a side surface of the non-display area 12 of the display device 10 may be implemented in a convex streamlined shape.

Accordingly, compared to the exemplary embodiment illustrated in FIG. 6A, the area, in which the non-display area 12 and the folding area FA overlap, may be a larger area, and the notch patterns NP1 and NP2 may be formed in the area having the larger area.

According to exemplary embodiments, a width of the display device 10 at the position corresponding to the folding line FL may be smaller than a maximum width and may be larger than a minimum width, but the present disclosure is not limited thereto, when the notch patterns NP1 and NP2 are sufficiently deep, the width of the display device 10 at the position corresponding to the folding line FL may be smallest.

Figure 6C:
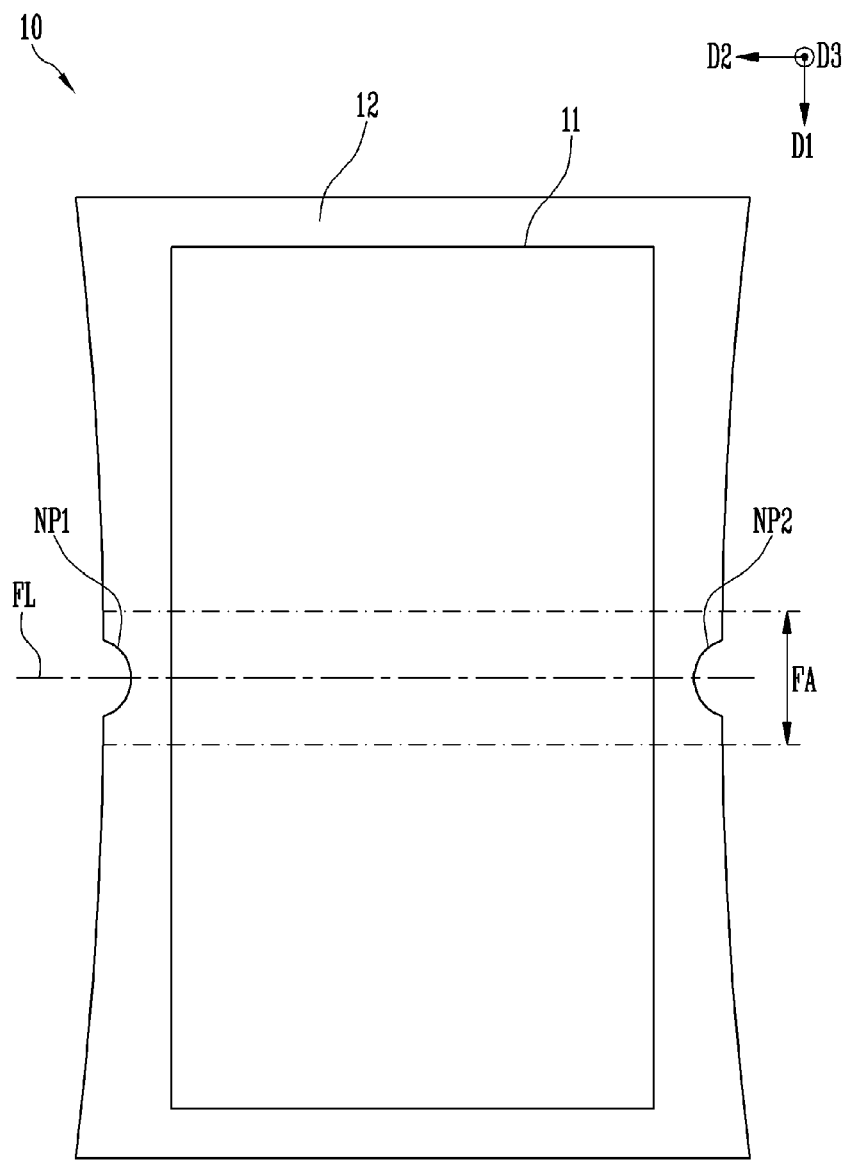
FIG. 6C is a top plan view illustrating one surface of the display device according to exemplary embodiments of the present disclosure.

FIG. 6C is a top plan view illustrating one surface of the display device according to exemplary embodiments of the present disclosure. In order to avoid the overlapping of the description, contents overlapping the contents described with reference to FIG. 6A will be omitted in the description with reference to FIG. 6C.

As illustrated in FIG. 6C, the display device 10 may have a concave parabola shape. For example, a side surface of the non-display area 12 of the display device 10 may be implemented in a concave streamlined shape.

Accordingly, compared to the exemplary embodiment of FIG. 6A, the display device 10 may be batter induced so as to be folded along the folding line FL.

According to exemplary embodiments, a minimum width of the display device 10 may be at a position corresponding to the folding line FL.

FIGS. 7A, 7B, 7C, and 7D are top plan views illustrating the notch patterns of the display device according to exemplary embodiments of the present disclosure. FIGS. 7A, 7B, 7C, and 7D illustrate exemplary embodiments of the notch patterns NP1 and NP2, but the present disclosure is not limited thereto.

Referring to FIGS. 1A, 6A, 6B, and 7A to 7D, the notch patterns NP1 and NP2 may have symmetric structures based on the folding line, and the notch patterns NP1 and NP2 formed at both sides may have symmetric structures, but the present disclosure is not limited thereto.

For convenience of the description, a part of the display surface of the display device 10 including the notch patterns NP1 and NP2 is illustrated and described.

Figure 7B:
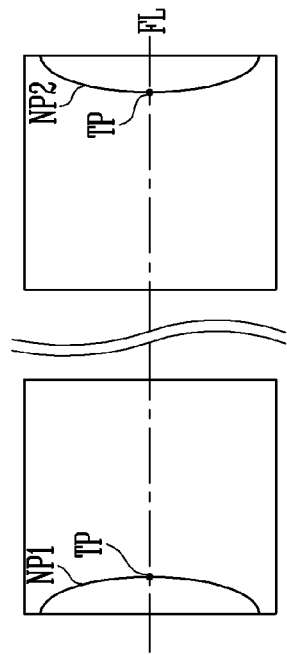
FIGS. 7A, 7B, 7C, and 7D are top plan views illustrating notch patterns of the display device according to exemplary embodiments of the present disclosure.
Figure 7D:
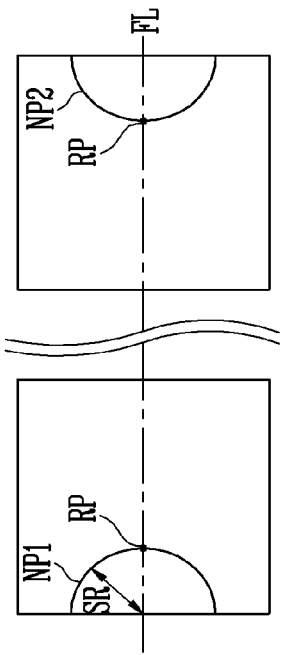
Figure 7A:
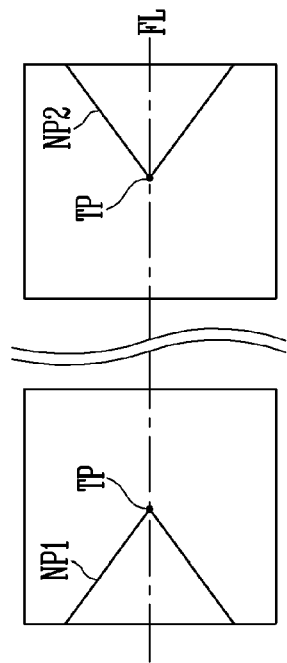

Referring to FIG. 7A, the notch patterns NP1 and NP2 may have triangular shapes. In this case, an apex of each of the notch patterns NP1 and NP2 may be positioned on the folding line FL.

Referring to FIG. 7B, the notch patterns NP1 and NP2 may have elliptical shapes. In this case, an apex of each of the notch patterns NP1 and NP2 may be positioned on the folding line FL.

Figure 7C:
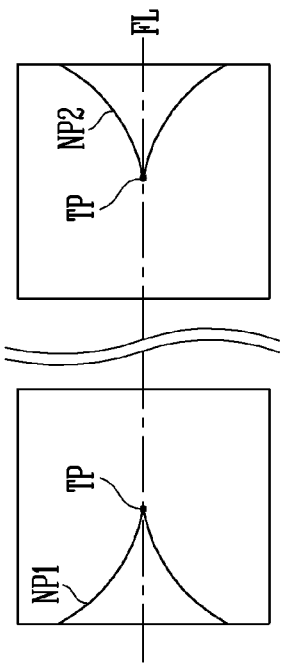

Referring to FIG. 7C, the notch patterns NP1 and NP2 may have awl shapes. For example, the awl shape may be a shape including two parabolas bent toward the folding line FL. In this case, an apex of each of the notch patterns NP1 and NP2 may be positioned on the folding line FL.

Referring to FIG. 7D, the notch patterns NP1 and NP2 may have semi-circular shapes having a notch radius SR. In this case, a radial point of each of the notch patterns NP1 and NP2 may be positioned on the folding line FL.

The apex TP and the radial point RP mean points having a maximum depth from side surfaces of the notch patterns NP1 and NP2.

Figure 8:
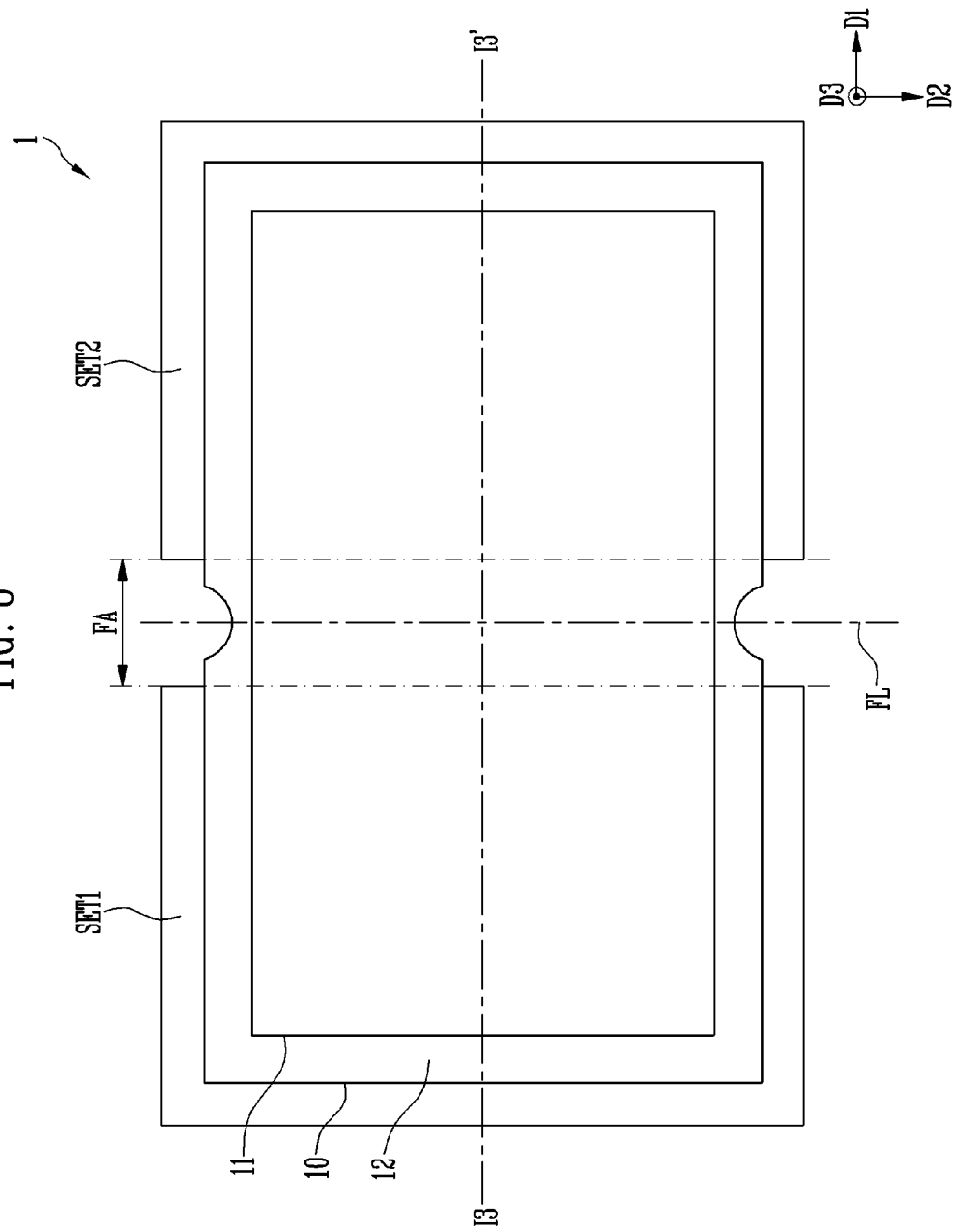
FIG. 8 is a top plan view illustrating one surface of an electronic device according to exemplary embodiments of the present disclosure.

FIG. 8 is a top plan view illustrating one surface of an electronic device according to exemplary embodiments of the present disclosure. FIG. 9 is a cross-sectional view illustrating an electronic device according to exemplary embodiments of the present disclosure. FIG. 9 illustrates a cross-section of an electronic device illustrated in FIG. 8 taken along line I3-I3' in a plane formed by the first directional axis D1 and the third directional axis D3.

Referring to FIGS. 8 and 9, the electronic device 1 may include the display device 10 illustrated in FIG. 1A and cases SET1 and SET2.

In order to avoid the overlapping of the description, contents overlapping the contents described with reference to FIG. 1A will be omitted in the description with reference to FIG. 8.

The display device 10 may be partially or wholly coupled to the cases SET1 and SET2. The coupling structure of the display device 10 and the cases SET1 and SET2 is not particularly limited.

For example, the cases SET1 and SET2 may provide a flat surface, on which the display device 10 is disposed. According to exemplary embodiments of the present disclosure, the cases SET1 and SET2 may define a predetermined space, and the display device 10 may be accommodated in the predetermined space. The cases SET1 and SET2 may define a stepped space, and the display device 10 may be accommodated in the stepped space.

The cases SET1 and SET2 may be disposed at a lower end of the display device 10, and may partially surround the display device 10.

As illustrated in FIGS. 8 and 9, the cases SET1 and SET2 may surround the area, except for the display surface of the display device 10 and the rear surface of the folding area FA.

However, the present disclosure is not limited thereto, and according to exemplary embodiments, the cases SET1 and SET2 may surround the areas, except for the side surface and the display surface of the display device 10, and the rear surface of the folding area FA.

Further, the cases SET1 and SET2 may be coupled to the rear surfaces of the non-folding areas NFA1 and NFA2 of the display device 10.

Accordingly, with the display device according to the exemplary embodiments of the present disclosure and the electronic device including the same, it is possible to implement a maximum stress line parallel to a folding line on a rear surface of a display surface of the display device.

Accordingly, according to the display device according to the exemplary embodiments of the present disclosure and the electronic device including the same, it is possible to effectively decrease a separation phenomenon of an encapsulation layer and a de-lamination phenomenon of an optically clear adhesive member caused by failure of the implementation of a physically ideal curve phenomenon, and a film crack defect phenomenon by the separation phenomenon and the de-lamination phenomenon.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
a display panel comprising a flexible substrate, the flexible substrate comprising:
a first portion corresponding to a display area of the display panel, the display area being configured to display an image; and
a second portion extending from the first portion, the second portion corresponding to a non-display area of the display panel adjacent to the display area,
wherein the display panel is configured to bend in a folding area based on a folding line extending in a width direction of the display panel and overlapping the flexible substrate such that a first non-folding area of the display panel and a second non-folding area of the display panel are positioned at opposite sides of the folding area, and
wherein a first notch pattern is formed in the flexible substrate of the display panel in an overlapping area in which a part of the second portion of the flexible substrate is removed in a region corresponding to a part of the folding area such that the first notch pattern reduces a width of the display panel in a region comprising the overlapping area.

2. The display device of claim 1, further comprising:
a window member disposed on the flexible substrate,
wherein the first notch pattern is formed in the window member such that a portion of the window member is removed.

3. The display device of claim 1, wherein the first notch pattern has an axisymmetric structure based on the folding line.

4. The display device of claim 1, wherein a second notch pattern is formed in the flexible substrate of the display panel in another overlapping area in which another part of the second portion of the flexible substrate is removed in another region corresponding to another part of the folding area, the second notch pattern being formed at an opposite side of the flexible substrate from a side in which the first notch pattern is formed.

5. The display device of claim 4, wherein the first notch pattern has a shape that is a mirror image of a shape of the second notch pattern.

6. The display device of claim 1, wherein the first notch pattern has a circular shape.

7. The display device of claim 1, wherein a side surface of the non-display area is a convex streamlined shape.

8. The display device of claim 1, wherein:
a side surface of the non-display area is a concave streamlined shape; and
a minimum width of the display device is at a position corresponding to the folding line.

9. The display device of claim 2, further comprising a touch sensor configured to obtain coordinate information about an input point.

10. The display device of claim 2, wherein the window member comprises:
a cover member; and
a black matrix disposed at a lower end of the cover member and defining the non-display area.

11. The display device of claim 1, wherein, in a direction perpendicular to the folding line, a size of the folding area is greater than a size of the first notch portion.

12. The display device of claim 2, wherein the first notch pattern extends completely through the display panel in a direction perpendicular to the folding line.

13. The display device of claim 9, wherein the first notch pattern is formed in the touch sensor such that a portion of the touch sensor is removed.

14. A display device, comprising:
a display panel comprising a flexible substrate, the flexible substrate comprising:
a first portion corresponding to a display area of the display panel, the display area being configured to display an image; and
a second portion extending from the first portion, the second portion corresponding to a non-display area of the display panel adjacent to the display area; and
a case configured to support the display panel in a folded state and an unfolded state,
wherein the display panel is configured to bend in a folding area based on a folding line overlapping the flexible substrate such that a first non-folding area of the display panel and a second non-folding area of the display panel are positioned at opposite sides of the folding area, and
wherein:
a first notch pattern is formed in the flexible substrate of the display panel in an overlapping area in which a part of the second portion of the flexible substrate is removed in a region corresponding to a part of the folding area; and
a third notch pattern is formed in the case such that the third notch pattern exposes a portion of the first notch pattern.

15. The display device of claim 14, wherein the case partially surrounds the display panel.

16. The display device of claim 14, wherein the case is coupled to a portion of the first non-folding area and a portion of the second non-folding area.

17. The display device of claim 14, wherein the third notch pattern is larger than the first notch pattern.

\* \* \* \* \*